(12) United States Patent
Nakano et al.

(10) Patent No.: US 6,828,258 B2
(45) Date of Patent: *Dec. 7, 2004

(54) METHOD OF FORMING AN INSULATING FILM HAVING SI-C, SI-O AND SI-H BONDS TO COVER WIRINGLINES OF A SEMICONDUCTOR DEVICE

(75) Inventors: Tadashi Nakano, Chiba (JP); Kyoji Tokunaga, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/133,321

(22) Filed: Apr. 29, 2002

(65) Prior Publication Data

US 2002/0158310 A1 Oct. 31, 2002

Related U.S. Application Data

(62) Division of application No. 08/492,108, filed as application No. PCT/JP94/02225 on Dec. 27, 1994, now Pat. No. 6,423,651.

(30) Foreign Application Priority Data

Dec. 27, 1993 (JP) ............................................. 5-331454

(51) Int. Cl.$^7$ ........................ H01L 21/31; H01L 21/469
(52) U.S. Cl. ..................... 438/781; 438/623; 438/782; 438/783
(58) Field of Search ................................ 438/781, 782, 438/783, 622, 642, 638; 257/759

(56) References Cited

U.S. PATENT DOCUMENTS

| | | | |
|---|---|---|---|
| 3,489,782 A | 1/1970 | Pruvost et al. | |
| 3,615,272 A | 10/1971 | Collins et al. | |
| 4,349,609 A | 9/1982 | Takeda et al. | |

(List continued on next page.)

FOREIGN PATENT DOCUMENTS

| | | | |
|---|---|---|---|
| EP | 0226208 A2 | * | 6/1987 |
| EP | 0 419 076 A1 | | 8/1990 |
| EP | 0 410 564 A2 | | 1/1991 |
| EP | 0 462 715 A1 | | 12/1991 |

(List continued on next page.)

OTHER PUBLICATIONS

Patent Abstract of Japan for JP–A–2–022475, "Production of Insulating Film Forming Solution and Semiconductor Device", vol. 014, No. 171 (C–0706), (1990).

Hawley's Condensed Chemical Dictionary, 12 Ed., Van Nostrand Reinhold Co., New York, p. 331, 1001 & 1002 (1993).

Abstract of JP–A–60–118760.

*Primary Examiner*—Erik Kielin
(74) *Attorney, Agent, or Firm*—Oliff & Berridge, PLC

(57) ABSTRACT

An insulating film which enables not only to obtain a good film quality but to achieve an excellent filling property, thick film formation and planarization simultaneously, an insulating film forming coating solution for forming the insulating film, and a method of manufacturing the insulating film are set forth. An insulating film forming coating solution containing as a main component a solution of a polymer obtained by co-hydrolysis of trialkoxysilane expressed by a general formula, $SiH(OR)_3$—, methyltrialkoxysilane expressed by a general formula, $SiCH_3(OR)_3$—, and tetraalkoxysilane expressed by a general formula, $Si(OR)_4$ is coated on a semiconductor substrate (1) having a step portion, and after it is heated and dried in an inert gas atmosphere, an insulating film (6) which is composed of a silane-derived compound expressed by a general formula, $SiH_x(CH_3)_yO_{2-(x+y)/2}$, where, $0<x<1$, $0<y<1$, $x+y \leq 1$ is formed.

25 Claims, 1 Drawing Sheet

U.S. PATENT DOCUMENTS

| | | |
|---|---|---|
| 4,388,449 A | 6/1983 | Bonnet et al. |
| 4,626,556 A * | 12/1986 | Nozue et al. ................. 522/99 |
| 4,670,299 A | 6/1987 | Fukuyama et al. |
| 4,865,649 A | 9/1989 | Kashiwagi et al. |
| 5,063,267 A | 11/1991 | Hanneman et al. |
| 5,096,990 A | 3/1992 | Takayanagi et al. |
| 5,145,723 A | 9/1992 | Ballance et al. |
| 5,270,074 A | 12/1993 | Kobayashi et al. |
| 5,320,868 A | 6/1994 | Ballance et al. |
| 5,370,903 A | 12/1994 | Mine et al. |
| 5,370,904 A | 12/1994 | Mine et al. |
| 5,372,842 A | 12/1994 | Mine et al. |
| 5,380,555 A | 1/1995 | Mine et al. |
| 5,441,765 A | 8/1995 | Balance et al. |
| 5,445,894 A | 8/1995 | Haluska et al. |
| 5,496,402 A | 3/1996 | Sakamoto et al. |
| 6,423,651 B1 * | 7/2002 | Nakano et al. ............. 438/782 |

FOREIGN PATENT DOCUMENTS

| | | |
|---|---|---|
| EP | 0 625 532 A1 | 5/1994 |
| JP | 60-86017 | 5/1985 |
| JP | 60-118760 | 6/1985 |
| JP | A-61-77695 | 4/1986 |
| JP | A-1-302823 | 5/1988 |
| JP | 40-3188179 | 8/1991 |
| JP | A-3-203240 | 9/1991 |

* cited by examiner

METHOD OF FORMING AN INSULATING FILM HAVING SI-C, SI-O AND SI-H BONDS TO COVER WIRINGLINES OF A SEMICONDUCTOR DEVICE

This is a Division of application Ser. No. 08/492,108 filed Aug. 29, 1995. The entire disclosure of the prior application(s) is hereby incorporated by reference herein in its entirety.

TECHNICAL FIELD

The present invention relates to an insulating film of a semiconductor device and a coating solution for forming the insulating film and a method of manufacturing the insulating film, and in particular, relates to an improvement in an insulating film which is provided between metal wiring lines formed on a large scale semiconductor integrated circuit, and a coating solution for forming the insulating film, and a method of manufacturing the insulating film.

BACKGROUND ART

In the prior art, with the progress in microminiaturization and high integration of a semiconductor device, a width of a device element and an interval between elements, for example, a width of a metal wiring line and its interval have been decreased more and more. In contrast, a height of the element such as the metal wiring line has not substantially been reduced for the reason that a wiring resistance and a current density cannot be increased to a great extent. Accordingly, in recent semiconductor devices, the interval between the metal wiring lines in a lateral direction is very narrow, and the height of the wiring line is still high. In such a large scale semiconductor integrated circuit, the aspect ratio of a height to a width of the metal wiring line has been increased remarkably. Such a trend of increase of the aspect ratio is not limited to the metal wiring line, and it is similar also in other device elements.

As an interlayer Insulating film which is formed on various elements such as the metal wiring lines of a high aspect ratio, it is required not only to insure insulation between the elements but also to have an excellent filling property which enables to fill up between the elements without leaving a void and to fill completely between the elements.

Furthermore, in order to insure a focus margin in lithography process conducted after formation of the interlayer insulating film, an excellent property for forming a planar surface is required, which enables to sufficiently moderate surface irregularities or undulation in the interlayer insulating film.

As the insulating film which can be filled between narrow elements as mentioned above, for example, there is a silicon oxide thin film formed by a chemical vapor deposition method by thermal decomposition or plasma decomposition of monosilane. However, in the insulating film (silicon oxide thin film) formed by this method, voids are apt to be formed between the elements, and actually, a sufficient filling property and a planarizing property are not obtained.

Accordingly, as the method of forming an insulating film which is excellent in the filling property of a narrow space between elements, there is a method of forming an insulating film by chemical vapor deposition by ozone oxidation of an organic silane as disclosed in Japanese Patent Laid-Open Publication No. 61-77695.

Furthermore, as disclosed in Japanese Patent Laid-Open Publication No. Hei 3-203240, there is an insulating film having a multilayer structure including a spin-on glass film (hereinafter referred to as an "SOG" film). In this prior art insulating film, an advantage is provided which enables to achieve a planar surface of the insulating film, because the occurrence of a crack in the SOG film can be prevented even when the SOG film is coated to a large thickness.

Furthermore, there is another prior art technique in which after filling a narrow space between the elements with an insulating film formed by chemical vapor deposition, an insulating film is further grown over the whole surface to a large thickness, and thereafter, an unnecessary insulating film is removed by a chemical mechanical polishing technique (CMP) thereby to achieve a planar surface of the insulating film.

However, in the insulating film formed by the method disclosed in the Japanese Patent Laid-Open Publication No. 61-77695, although the filling property of a narrow space between the elements is excellent, on the other hand, there is a drawback that a film thickness becomes thin when the insulating film is formed on a pad or a flat and wide interval between the elements. Accordingly, there is a problem that planarization cannot be achieved over the whole region of the surface.

Furthermore, in the insulating film having a multilayer structure including an SOG film obtained by the method disclosed in the Japanese Patent Laid-Open Publication No. Hei 3-203240, although the occurrence of a crack in the SOG film is prevented to some extent, there is a problem that peeling and crack are easily occurred in a film other than the SOG film constituting the above-mentioned insulating film due to a difference in a shrinkage ratio between the SOG film and the other film. Furthermore, there is a problem that planarization cannot be achieved sufficiently over the whole region of the surface.

Furthermore, in the prior art in which the chemical vapor deposition technique is combined with the chemical mechanical polishing technique, it is possible to insure the planar surface formation over the whole region of the semiconductor substrate depending on conditions, however, there is a problem that the setting of the conditions is difficult. Moreover, there is a problem that expensive apparatus is needed, and this leads to a large increase in costs. There is another problem that the detection of an end point is difficult in the chemical mechanical polishing, and non-uniformity between the wafers is large and the throughput is low. Furthermore, there is a problem that the yield is low due to the occurrence of contamination and particles.

DISCLOSURE OF THE INVENTION

The present invention solves the problems in the prior art as mentioned above, and it is an object to provide an insulating film of a semiconductor device and an insulation film forming coating solution for forming the insulating film and a method of manufacturing the insulating film, which of course enables to obtain a good film quality wherein the shrinkage ratio is small, and the oxygen plasma resistant property and the etching workability are excellent and the crack is not occurred, and also the excellent filling property and the formation of a thick film and the planar surface forming property are simultaneously achieved.

In order to achieve the object, the invention in claims 1 and 2 relates to an insulating film of a semiconductor device, and it provides an insulating film of a semiconductor device characterized in that the insulating film comprises a silane-derived compound expressed by a general formula, $SiH_x(CH_3)_yO_{2-(x+y)/2}$ (where, $0<x<1$, $0<y<1$, $x+y \leq 1$).

Furthermore, the invention of claims 3 to 5 relates to an insulating film forming coating solution for forming an insulating film of a semiconductor device, and it provides an insulating film forming coating solution containing as a main component a solution of a polymer obtained by co-hydrolysis of.

trialkoxysilane expressed by a general formula, SiH (OR)$_3$, and methyltrialkoxysilane expressed by a general formula, SiCH$_3$(OR)$_3$.

Furthermore, the invention of claims 6 to 8 relates to an insulating film forming coating solution for forming an insulating film of a semiconductor device, and it provides an insulating film forming coating solution containing as a main component a solution of a polymer obtained by co-hydrolysis of, tetraalkoxysilane expressed by a general formula, Si (OR)$_4$, trialkoxysilane expressed by a general formula, SiH (OR)$_3$, and methyltrialkoxysilane expressed by a general formula, SiCH$_3$(OR)$_3$.

Furthermore, the invention of claims 9 relates to a method of forming an insulating film of a semiconductor device, and it provides a method of forming an insulating film comprising the steps of coating the insulating film forming coating solution described in any of claims 3 to 8 on a semiconductor substrate having a desired pattern formed thereon, and drying the coated insulating film forming coating solution and thereafter heating and curing in an inert gas atmosphere.

The insulating film described in claims 1 and 2 is comprised of the silane-derived compound expressed by the general formula, SiH$_x$(CH$_3$)$_y$O$_{2-(x+y)/2}$ (where, $0<x<1$, $0<y<1$, $x+y\leq1$), and thus, the insulating film has a structure having H (hydrogen) which is directly bonded to Si (silicon) and which is introduced into the insulating film. Accordingly, in the insulating film, the shrinkage rate is reduced without impairing the oxygen plasma resistant property and the etching workability.

Furthermore, in view of the oxygen plasma resistant property and the etching workability, it is preferable that $y\leq0.8$, and in view of the crack resistant property, it is preferable that $0.2\leq y$.

The reason for this will be described below. The usual SOG film which has been used in the prior art includes O (oxygen), and C (carbon) of a methyl group which are counterparts for directly bonding to Si. When Si bonds to only O, with respect to Si—OR or Si—OH in the coating film, end groups are bonded to each other during curing process, and a crosslinked network of Si—O—Si is developed. Thus, the shrinkage rate is increased, and the film becomes fragile since the hardness is increased. As a result, cracks are easily occurred, and a thick film having a thickness of 3000 Å or larger cannot be formed.

On the other hand, when the methyl group is introduced into Si to the extent having a maximum ratio of Si:C=2:1, the shrinkage rate of the obtained insulating film can be reduced, and at the same time, the film is made flexible, and it is possible to form a film having a maximum thickness of about 5000 Å. However, the shrinkage rate of the film cannot be reduced to lower than about 7%.

Accordingly, in order to reduce the shrinkage rate of the above-mentioned film and to form a thick film, when the content of C (an introduced quantity of methyl group) in the insulating film is increased, then the Si—C bond is oxidized and decomposed, and the oxygen plasma resistant property is degraded. Furthermore, since the reaction with CHF$_3$ contained in etching gas occurs to produce a great amount of fluorocarbon polymer, a problem arises in which the etching workability is degraded to a great extent.

Here, the action to reduce the shrinkage rate of the above-mentioned film and to make the film flexible is caused by the presence of C due to the introduction of the methyl group. In other words, due to the presence of C, the number of O bonded to Si is reduced from 4 to 3, and the remaining bond is Si—C so that the shrinkage rate of the film is reduced and the flexibility of the film is improved. This effect can be also obtained by using the bond of Si—H in place of the Si—C. Accordingly, it is possible to reduce the shrinkage rate of the film and to make the film flexible by increasing the amount of H without increasing the amount of C present in the insulating film. As a result, the shrinkage rate of the insulating film is reduced and the formation of a thick film can be achieved without degrading the oxygen plasma resistant property and the etching workability.

Furthermore, by introducing the Si—H bond, the reduction of the water absorption property and the water resistant property of the insulating film can be attained as a result of a strong hydrophobic nature of the Si—H bond.

Also, the dielectric constant is decreased due to the reduction of water content, and when the film is used as an interlayer insulating film between metal wiring lines, an advantage of reducing a parasitic capasitance is obtained.

Since the insulating film forming coating solution in claims 3 to 5 is a liquid, the coating solution can be filled up into a narrow gap of an underlying step portion with priority, and the filling property is improved and at the same time, the planarization can be achieved.

Furthermore, the insulating film obtained by drying the insulating film forming coating solution has a structure in which H which directly bonds to Si is introduced. Accordingly, in the insulating film, the number of O which bonds to Si is reduced from 4 to 3, and the remaining bond is Si—H or Si—C. As a result, the amount of H is increased without increasing the amount of C which is present in the insulating film, and thus, the shrinkage rate of the film is reduced and the film can be made flexible. For this reason, the shrinkage rate of the insulating film is reduced, and the formation of a thick film can be achieved without degrading the oxygen plasma resistant property and the etching workability.

Here, as the trialkoxysilane expressed by the general formula, SiH (OR)$_3$, for example, trimethoxysilane, triethoxysilane, or the like is suitably used.

Furthermore, as the methyltrialkoxysilane expressed by the general formula, SiCH$_3$ (OR)$_3$, methyltrimethoxysilane, methyltriethoxysilane, or the like is suitably used.

Also in the hydrolysis, besides water, an acid such as formic acid, acetic acid, phosphoric acid, hydrochloric acid, may be used as a catalyst.

Furthermore, in the hydrolysis, another organic silane group such as dimethyldiethoxysilane, phenyltrimethoxysilane, or the like may be mixed as a modifying agent.

Furthermore, both the catalyst and the modifying agent may be jointly mixed.

The molecular weight of a polymer obtained by the hydrolysis can be changed by a temperature, a time, and a concentration in a condensation and polymerization method. However, when the molecular weight exceeds about 100000, the polymer becomes insoluble to a solvent. Thus, it is desirable that the molecular weight of the polymer is equal to 100000 or less.

Furthermore, when the molecular weight is less than 1000, the amount of the polymer which is not cured but volatized by heating is increased. Accordingly, it is desirable that the molecular weight of the polymer is equal to 1000 or larger.

Furthermore, preferably, the molecular weight is suitable when it is about 1500 to 10000.

The polymer which is obtained in the hydrolysis is soluble to various of solvents, and in particular, lower alchohol such as methanol, ethanol, 2-propanol, or the like, glycol-ethers such as 2-ethoxyethanol, or the like, ketons such as methyl-isobutylketon or the like, carbolic-acid esters such as isobutylacetate or the like may be suitably used. However, when the boiling point of the solvent is low, the drying progresses too fast, and peeling or cracking is caused sometimes. On the other hand, when the boiling point is too high, it takes a long time for drying. Accordingly, it is preferable to use a solvent having an intermediate boiling point of about 100 to 180° C.

Furthermore, if the concentration of the solution of the above-mentioned polymer is too high, striation and defective filling are apt to be caused, and if the concentration of the solution of the above-mentioned polymer is too low, a film thickness obtained by one time of coating will be thin. Accordingly, the concentration of the solution of the above-mentioned polymer is suitably 5 to 50 weight %.

As the insulating film forming coating solution in claims 6 to 8 is a liquid, the coating solution can be filled up a narrow gap in an underlying step portion with priority, and thus, the filling property is improved and the planarization can be achieved.

Furthermore, the insulating film obtained by coating and drying the insulating film forming coating solution has a structure in which H which is bonded directly to Si is introduced. Accordingly, in the insulating film, the number of O which is bonded to Si is reduced from 4to 3, and the remaining bond is Si—H or Si—C. Thus, the shrinkage rate of the film can be reduced and the film can be made flexible by increasing the amount of H without increasing the amount of C.

As a result, the shrinkage rate of the insulating film is reduced and the formation of a thick film can be achieved without impairing the oxygen plasma resistant property and the etching workability.

In the insulating film forming coating solution, tetraalkoxysilane expressed by the general formula, $Si(OR)_4$, trialkoxysilane expressed by the general formula, $SiH(OR)_3$, and methyltrialkoxysilane expressed by the general formula, $SiCH3(OR)3$ are co-hydrolized, alternatively, the tetraalkoxysilane, trialkoxysilane, and methyltrialkoxysilane are individually hydrolized and polymerized, and the resultant products may be mixed.

As the tetraalkoxysilane expressed by the general formula, $Si(OR)_4$ for example, tetramethoxysilane, tetraethoxysilane, or the like is suitably used.

As the trialkoxysilane expressed by the general formula, $SiH(OR)_3$, similar compounds listed in the description of the action relating to claim 2 are suitably used.

As the methyltrialkoxysilane expressed by the general formula, $SiCH_3(OR)_3$, similar compounds listed in the description of the action relating to claims 3 to 5 are suitably used.

Furthermore, also in the hydrolysis mentioned above, the catalyst or the modifying agent listed in the description of the action relating to claim 2 may be mixed, or both the catalyst and the modifying agent may be jointly mixed.

The molecular weight of the polymer obtained by the hydrolysis is desirably equal to 1000 or more, or equal to 100000 or less for the same reason as described as to the action in claims 3 to 5. It is further preferable to select the molecular weight about 1500 to 10000.

As the solvent which is usable with the polymer obtained in the hydrolysis, those solvents listed in the description of the action in claim 2 is used suitably. However, also in this case, when the boiling point of the solvent is low, the drying progresses too fast, and the brushing and cracking might be caused, and when the boiling point of the solvent is too high, it takes a long time for the drying. Thus, it is desirable to use a solvent having an intermediate boiling point of about 100 to 180 ° C.

Furthermore, when the concentration of the solution of the above-mentioned polymer is too high, striation and defective filling are apt to be caused, and when the concentration of the solution of the above-mentioned polymer is too low, the film thickness obtained by one time of coating will be thin. Accordingly, the concentration of the solution of the above-mentioned polymer is suitable when it is selected to be 5 to 50 weight %.

In the method of manufacturing the insulating film in claim 9, by coating the insulating film forming solution described in any of claims 3 to 8, it is possible to make the insulating film forming solution fill into a narrow recess in the underlying step portion (a desired pattern formed on the semiconductor substrate). Accordingly, the filling property is improved, and the planarization can be achieved.

Furthermore, after drying the coated insulating film, by heating and curing in an inert gas atmosphere, the insulating film forming solution is polymerized and cured without being mixed with oxygen. Accordingly, at the time of polymerization and curing of the insulating film forming solution, the insulating film forming solution is not oxidized. Thus, the insulating film obtained in this process has the structure in which H which is directly bonded to Si is introduced. As a result, in the insulating film, the average number of O which is bonded to Si is equal to 3 or more, and equal to 4 or less, and the remaining bond is Si—H or Si—C. Thus, the shrinkage rate of the film can be reduced and the film can be made flexible. For this reason, the shrinkage rate of the insulating film is reduced and the formation of a thick film is achieved without impairing the oxygen plasma resistant property and the etching workability.

As inert gases, for example, nitrogen, argon,hydrogen, helium, forming gas, or the like may be used suitably.

Figure 1A:
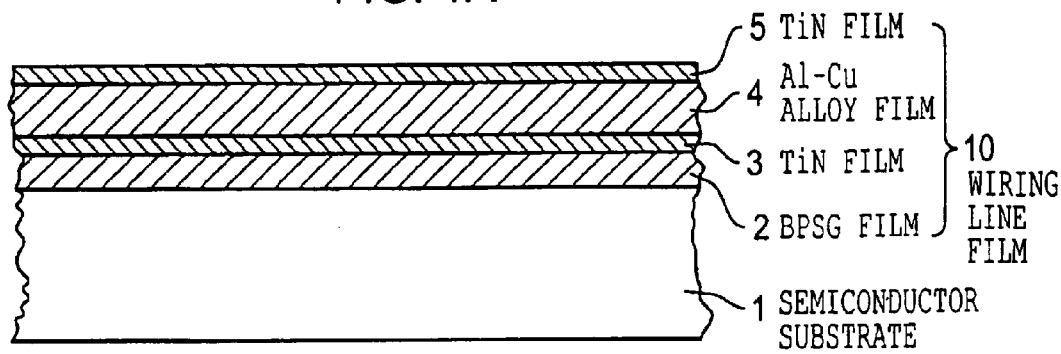
FIG. 1A is a partial sectional view showing a process of forming an insulating film of a semiconductor device according to an embodiment of the present invention.

Explanation of reference numerals: 1 . . . semiconductor substrate, 2 . . . BPSG film, 3 . . . TiN film, 4 . . . Al—Cu alloy film, 5 . . . TiN film, 6 . . . insulating film, 10 . . . wiring line film, 11 . . . wiring line.

BEST MODE FOR IMPLEMENTING THE INVENTION

An embodiment of the present invention will be described.

First, a method of compounding an insulating film forming coating solution used in forming an insulating film of a semiconductor device will be described.

Tetraethoxysilane (Si(OC$_2$H$_5$)$_4$) having a purity of 99.9% triethoxysilane (SiH(OC$_2$H$_5$)$_3$) having a purity of 99.9%, and methyltriethoxysilane (CH$_3$Si(OC$_2$H$_5$)$_3$ having a purity of 99.9% are prepared, and these materials are mixed in accordance with a compounding quantity (molar ratio %) shown in Table 1 so that a total quantity equals 1 mol.

In this case, the above-mentioned tetraethoxysilane (Si (OC$_2$H$_5$)$_4$) corresponds to tetraalkoxysilane expressed by the general formula Si(OR)$_4$ in the present invention, and the above-mentioned triethoxysilane (SiH(OC$_2$H$_5$)$_3$) corresponds to trialkoxysilane expressed by the general formula SiH(OR)$_3$ in the present invention, and the above-mentioned methyltriethoxysilane (CH$_3$Si(OC$_2$H$_5$)$_3$) corresponds to methyltrialkoxysilane expressed by the general formula SiCH$_3$(OR)$_3$ in the present invention.

Following this, the obtained mixed solution is mixed with 2 mols of water, 1 mol of ethanol, and 0.01 mol of phosphoric acid, and stirred for 24 hours at 50° C. so that hydrolytic reaction takes place.

Subsequently, the obtained product is dissolved by 2-ethoxyethanol, and produces an insulating film forming coating solution having a solid concentration of 20%.

Thereafter, an underlying material on which the insulating film forming coating solution is coated is manufactured by a method described below.

First, a silicon substrate (wafer) having a diameter of 8 inches is prepared.

In a process shown in FIG. 1A, a BPSG (Boron Phosphorus Silicate Glass) film 2 is formed on the silicon substrate 1 to a film thickness of about 1.0 μm.

Subsequently, a TiN (titanium nitride) film 3 is deposited to a film thickness of about 0.1 μm on the BPSG film 2. Then an Al—Cu alloy (an alloy of aluminum and copper) film 4 is deposited to a film thickness of about 0.8 μm on the TiN film 3. Then, a TiN (titanium nitride) film 5 is deposited to a film thickness of about 0.1 μm on the Al—Cu alloy film 4.

In this manner, a wiring line film 10 having a three-layer structure made up of the TiN film 3, the Al—Cu alloy film 4, and the TiN film 5 is formed.

Figure 1B:
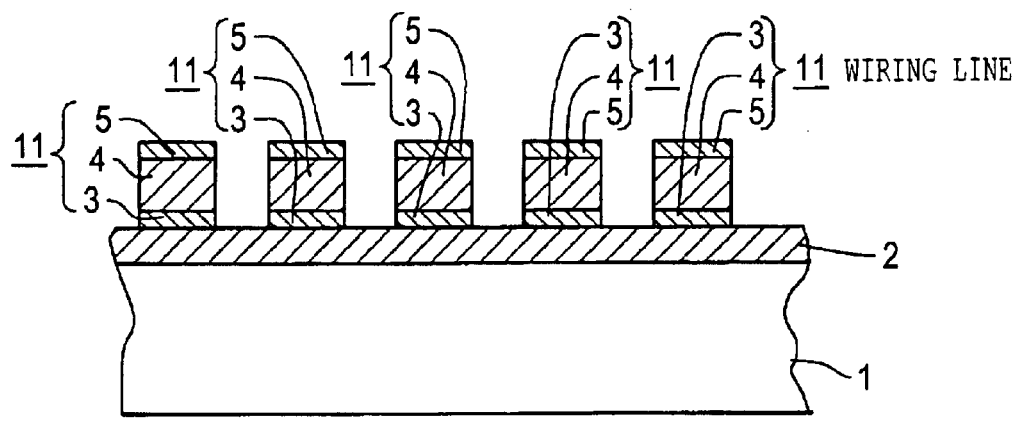
FIG. 1B is a partial sectional view showing a process of forming the insulating film of the semiconductor device according to the embodiment of the present invention.

Next, in a process shown in FIG. 1B, patterning is performed on the wiring line film 10 which was obtained in the process shown in FIG. 1A, and a wiring line 11 having a width of about 0.5 μm, a height of about 1.0 μm, and a distance (interval) between wiring lines of 0.2 μm is formed.

In this embodiment, for the purpose of test which is performed in the next process, 18 sheets of semiconductor substrates 1 (wafer) each having the wiring line 11 are manufactured.

Figure 1C:
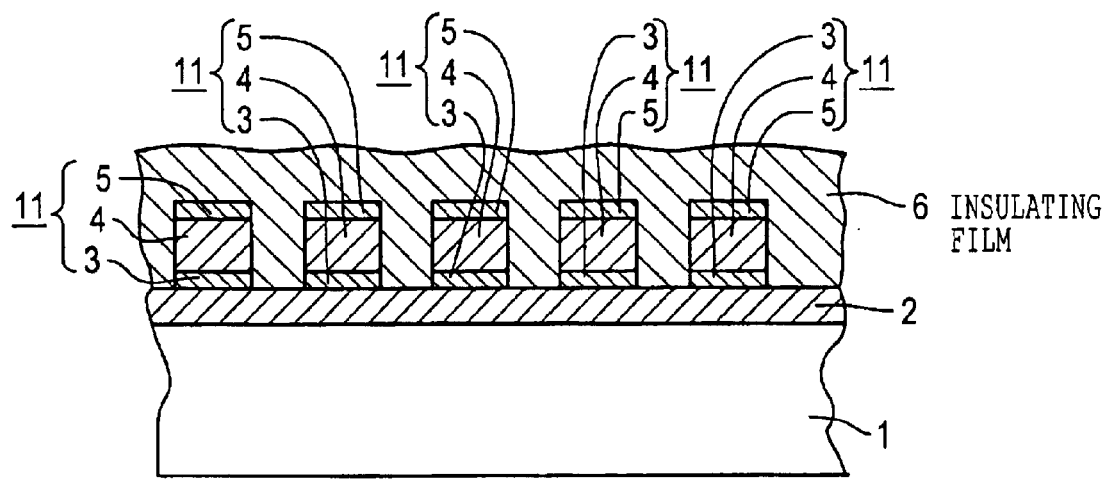
FIG. 1C is a partial sectional view showing a process of forming the insulating film of the semiconductor device according to the embodiment of the present invention.

Following this, in a process shown in FIG. 1C, the semiconductor substrate 1 obtained in the process shown in FIG. 1B is mounted on a spin coater, and each kind of the insulating film forming coating solutions (sample No. 1 to No. 18) having the compounding ratio shown in Table 1 is coated on one of the semiconductor substrates 1 under the following conditions.

Coating conditions:
number of revolutions 1000 to 7000 revolutions/minute
film thickness 1 μm Thereafter, the 18 sheets of semiconductor substrates 1 each coated with corresponding one of the insulating film forming coating solutions are left to stand for 3 minutes in atmosphere at about 150° C. so that the solvent is volatized. Subsequently, the semiconductor substrates 1 are heated for 60 minutes in nitrogen flow at about 400° C. thereby to cure the insulating film forming coating solution and to obtain an insulating film 6.

In this case, the insulating film which is obtained by coating, drying, and curing each of the samples No.2 to No.11 and samples No.13 to No.17 is constituted by a silane-derived compound expressed by a general formula, SiH$_x$ (CH$_3$)$_y$O$_{2-(x+y)/2}$ (where, 0<x<1, 0<y<1, x+y≦1).

Then, the shrinkage rate of the insulating film 6 obtained in the process shown in FIG. 1C is measured a film thickness by an ellipsometer before and after the heating process at about 400° C. Furthermore, the oxygen plasma resistant property of the insulating film 6 is investigated on the basis of the presence or absence of crack occurrence observed by an optical microscope after an asher treatment. Moreover, the planarization property, crack occurring state, and filling property of the insulating film 6 are investigated by observing a cross section of the insulating film 6 by a scanning electron microscope.

The results are shown In Table 2. From Table 2, it is confirmed that the insulating films (sample No.2 to No.11, sample No.13 to 17) are excellent in all the shrinkage rate, oxygen plasma resistant property, planarization property, cracking, and tilling property of the insulating film.

Furthermore, from Table 2, it is seen that sample No.1 which is a comparison product is inferior in the oxygen plasma resistant property, and in sample No.12 which is a comparison product, a crack is caused, and in sample No.18 which is a comparison product, the shrinkage rate is large, and it is inferior in the planarization property and oxygen plasma resistant property.

From these results, it is proved that the insulating film constituted by the silane-derived compound expressed by the general formula, SiH$_x$(CH$_3$)$_y$O$_{2-(x+y)/2}$ (where, 0<x<1, 0<y<1, x+y≦1) has a small shrinkage rate, and it is excellent in the oxygen plasma resistant property and etching workability, and the crack is not generated. Thus, the good film quality is of course obtained, and the excellent filling property, thick film forming property, and planarization property are simultaneously achieved.

In the embodiment, the insulating film forming coating solution is used which contains as a main component the solution of the polymer obtained by hydrolysis of the tetraethoxysilane, triethoxysilane, and methyltriethoxysilane. However, similar advantageous effects as mentioned above will be obtained if an insulating film forming coating solution is used which contains as a main component a solution of a polymer obtained by hydrolysis, not limited to an ethoxy group, trialkoxysilane expressed by a general formula, SiH (OR)$_3$ and methyltrialkoxysilane expressed by a general formula, SiCH$_3$ (OR)$_3$.

Furthermore, similar advantageous effects mentioned above will be obtained even if an insulating film forming coating solution is used which contains as a main component a solution of a polymer obtained by hydrolysis of tetraalkoxysilane expressed by a general formula, Si (OR)$_4$, trialkoxysilane expressed by a general formula, SiH (OR)$_3$, and methyltrialkoxysilane expressed by a general formula, SiCH$_3$ (OR)$_3$.

Furthermore, in the embodiment, the mixed solution of the tetraethoxysilane, triethoxysilane, and methyltriethoxysilane is mixed with 2 mols of water, 1 mol of ethanol, and 0.01 mol of phosphoric acid, and stirred for 24 hours at 50° C. to carry out the hydrolytic reaction. However, the present invention is not limited to this, and the conditions for carrying out the hydrolytic reaction may be set arbitrarily as desired.

Furthermore, in the embodiment, it is described as to the method of carrying out the hydrolytic reaction after mixing the tetraethoxysilane, triethoxysilane, and methyltriethoxysilane. However, the present invention is not limited to this, and the tetraethoxysilane, triethoxysilane, and methyltriethoxysilane may be individually hydrolyzed and polymerized, and these resultant products may be mixed.

Furthermore, in the embodiment, the product obtained by the hydrolytic reaction is dissolved in 2-ethoxyethanol, and the insulating film forming coating solution having a solid concentration of 20% is produced. However, the present invention is not limited to this, and the solid in the insulating film forming coating solution may be determined arbitrarily as desired. Also, as the solution which dissolves the product, other solutions may be used if the product is soluble to the solutions and the nature of the produced insulating film forming coating solution is not impaired.

Furthermore, in the embodiment, as the underlying material on which the insulating film forming coating solution is coated, the wiring line pattern having a width of about 0.5 $\mu$m, a height of about 1.0 $\mu$m, and a distance between the wiring lines of 0.2 $\mu$m is formed. However, the present invention is not limited to this, and the present invention is applicable as the insulating film which is formed on the underlying material of all patterns, and the insulating film may of course be formed on an underlying material having an element other than the wiring lines formed thereon.

In the embodiment, the insulating film 6 having the film thickness of about 1 $\mu$m is formed, however, it is not limited to this, and the film thickness of the insulating film 6 may be determined as desired.

Furthermore, in the embodiment, the insulating film forming coating solution is coated by using the spin coater, however, it is not limited to this, and the coating solution may be coated by other methods if it is possible to coat the insulating film forming coating solution uniformly on the underlying material.

Furthermore, in the embodiment, after the insulating film forming coating solution is coated on the semiconductor substrate 1 and drying, it is heated for 60 minutes in nitrogen flow at about 400° C. so that the insulating film forming coating solution is cured. However, the present invention is not limited to this, and the atmosphere used during curing is only required to be inert.

INDUSTRIAL UTILIZABILITY

As described in the foregoings, the insulating film of a semiconductor in claims 1 and 2 is composed of the silane-derived compound expressed by the general formula, $SiH_x(H_3)_yO_{2-(x+y)/2}$ (where, 0<x<1, 0<y<1, x+y≦1), and thus, it has the structure in which H which is bonded directly to Si is introduced into the insulating film. As a result, in the insulating film, the average number of O which is bonded to Si is equal to 3 or more and equal to 4 or less, and the remaining bond is Si—H or Si—C. Accordingly, the shrinkage rate of the insulating film can be reduced and the film can be made flexible by increasing the amount of H without increasing the amount of C. As a result of this, not only a satisfactory film quality is obtained wherein the shrinkage rate is small, the oxygen plasma resistant property and etching workability are excellent, and the crack is not caused, but also the excellent filling property, and the thick film formation and planarization property can be achieved simultaneously.

The insulating film forming coating solution in claims 3 to 5 contains as the main component the solution of the polymer obtained by hydrolysis of the trialkoxysilane expressed by the general formula, $SiH(OR)_3$ and the methyltrialkoxysilane expressed by the general formula, $SiCH_3(OR)_3$. Accordingly, when the coating solution is coated on the underlying step portion, it can be filled into even a narrow gap in the underlying step portion with priority. For this reason, the filling property is improved, and at the same time, the planarization can be achieved.

Furthermore, the insulating film which is obtained by coating, drying, and curing the insulating film forming coating solution has a structure in which H which is directly bonded to Si is introduced. As a result, in the insulating film, the number of O which is bonded to Si is 3, and the rest of the bonds is Si—H or Si—C. Thus, the shrinkage rate of the film can be reduced and the film can be made flexible by increasing the amount of H without increasing the amount of C in the insulating film.

As a result, not only a satisfactory film quality wherein the shrinkage rate is small, the oxygen plasma resistant property and etching workability are excellent, and the crack is not caused Is obtained, but also the excellent filling property,.the thick film formation and planarization can be simultaneously achieved.

The insulating film forming coating solution in claims 6 to 8 contains as the main component the solution of the polymer which is obtained by hydrolysis of the tetraalkoxysilane expressed by the general formula, $Si(OR)_4$, trialkoxysilane expressed by the general formula, $SiH(OR)_3$, and methyltrialkoxysilane expressed by the general, formula, $SiCH_3(OR)_3$. As a result, when the coating solution is coated on the underlying step portion, it can be filled even into a narrow gap in the underlying step portion with priority. Thus, the filling property is improved, and at the same time, the planarization can be achieved.

Furthermore, the insulating film which is obtained by coating, drying, and curing the insulating film forming coating solution has the structure in which H which is directly bonded to Si is introduced. As a result, in the insulating film, the average number of O which is bonded to Si is equal to 3 or more and equal to 4 or less, and rest of the bonds is Si—H or Si—C. Thus, the shrinkage rate of the film can be reduced and the film can be made flexible by increasing the amount of H without increasing the amount of C in the insulating film.

As a result, not only a satisfactory film quality wherein the shrinkage rate is small, the oxygen plasma resistant property and etching workability are excellent, and the crack is not caused is obtained, but also the excellent filling property, the thick film formation and planarization can be simultaneously achieved.

Furthermore, in the method of manufacturing the insulating film in claim 9, the insulating film forming coating solution according to claims 3 to 5 or claims 6 to 8 is coated. Thus, the insulating film forming coating solution can be filled even into a narrow gap in the underlying step portion with prioity, and the planarization can be achieved.

Furthermore, after drying the coated insulating film forming coating solution, it is heated and cured in an inert gas atmosphere. As a result, the insulating film thus obtained has the structure in which H which is directly bonded to Si is introduced. Thus, in the insulating film, the average number of O which is bonded to Si is equal to 3 or more and equal to 4 or less, and the rest of the bonds is Si—H or Si—C. Accordingly, the shrinkage rate of the film can be reduced and the film can be made flexible without increasing the amount of C in the insulating film.

As a result, not only a satisfactory film quality wherein the shrinkage rate is small, the oxygen plasma resistant property and etching workability are excellent, and the crack is not caused is obtained, but also the excellent filling property, the thick film formation and planarization can be simultaneously achieved.

TABLE 1

| SAMPLE NO. | MIXING RATIO | | | REMARKS |
| --- | --- | --- | --- | --- |
| | HSi(OC$_2$H$_5$)$_3$ | CH$_3$Si(OC$_2$H$_5$)$_3$ | Si(OC$_2$H$_5$)$_4$ | |
| 1 | 0 | 100 | 0 | COMPARISON PRODUCT |
| 2 | 1 | 99 | 0 | INVENTION PRODUCT |
| 3 | 5 | 95 | 0 | INVENTION PRODUCT |
| 4 | 10 | 90 | 0 | INVENTION PRODUCT |
| 5 | 25 | 75 | 0 | INVENTION PRODUCT |
| 6 | 33 | 67 | 0 | INVENTION PRODUCT |
| 7 | 50 | 50 | 0 | INVENTION PRODUCT |
| 8 | 67 | 33 | 0 | INVENTION PRODUCT |
| 9 | 75 | 25 | 0 | INVENTION PRODUCT |
| 10 | 90 | 10 | 0 | INVENTION PRODUCT |
| 11 | 99 | 1 | 0 | INVENTION PRODUCT |
| 12 | 100 | 0 | 0 | COMPARISON PRODUCT |
| 13 | 10 | 80 | 10 | INVENTION PRODUCT |
| 14 | 30 | 30 | 40 | INVENTION PRODUCT |
| 15 | 30 | 10 | 60 | INVENTION PRODUCT |
| 16 | 50 | 0 | 50 | INVENTION PRODUCT |
| 17 | 80 | 10 | 10 | INVENTION PRODUCT |
| 18 | 0 | 50 | 50 | COMPARISON PRODUCT |

TABLE 2

| SAMPLE NO. | SHRINKAGE RATE (%) | OXYGEN PLASMA RESISTANT PROPERTY | PLANARIZATION INDEX ($\mu$m) WHEN COATED 1 $\mu$m | CRACK OCCURRANCE WHEN COATED 1 $\mu$m | GAP-FILLING PROPERTY OF WHEN COATED 0.2 $\mu$m |
| --- | --- | --- | --- | --- | --- |
| 1 | 7.0 | NO GOOD | ±0.20 | NONE | GOOD |
| 2 | 5.0 | GOOD | ±0.15 | NONE | GOOD |
| 3 | 4.3 | GOOD | ±0.13 | NONE | GOOD |
| 4 | 3.2 | GOOD | ±0.10 | NONE | GOOD |
| 5 | 2.7 | GOOD | ±0.10 | NONE | GOOD |
| 6 | 2.0 | GOOD | ±0.05 | NONE | GOOD |
| 7 | 1.0 | GOOD | ±0.02 UNDER | NONE | GOOD |
| 8 | 0.7 | GOOD | ±0.02 UNDER | NONE | GOOD |
| 9 | 0 | GOOD | ±0.02 UNDER | NONE | GOOD |
| 10 | 0 | GOOD | ±0.02 UNDER | NONE | GOOD |
| 11 | 0 | GOOD | ±0.02 UNDER | NONE | GOOD |
| 12 | 0 | GOOD | ±0.02 UNDER | EXIST | GOOD |
| 13 | 1.0 | GOOD | ±0.13 | NONE | GOOD |
| 14 | 3.6 | GOOD | ±0.13 | NONE | GOOD |
| 15 | 3.9 | GOOD | ±0.15 | NONE | GOOD |
| 16 | 4.6 | GOOD | ±0.18 | NONE | GOOD |
| 17 | 0 | GOOD | ±0.10 | NONE | GOOD |
| 18 | 8.5 | NO GOOD | ±0.85 | EXIST | NO GOOD |

What is claimed is:

1. A method of forming a semiconductor device, comprising:

providing a semiconductor substrate having wiring lines thereon;

forming an insulating film that covers the wiring lines, the insulating film consisting essentially of a silane-derived compound expressed by the general formula SiH$_x$(CH$_3$)$_y$O$_{2-(x+y)/2}$, where $0<x<1$, $0.2 \leq y \leq 1$, $x+y \leq 1$, wherein said insulating film has been heated at a temperature of about 400° C.

2. The method of claim 1, wherein at least 20% of the silicon atoms are each bonded to three of the oxygen atoms and one of the carbon atoms.

3. The method of claim 1, wherein $0.2 \leq y \leq 0.8$.

4. The method of claim 1, wherein the insulating film consists essentially of silicon atoms each bonded to at least three oxygen atoms.

5. A method of forming a semiconductor device, comprising:

providing a semiconductor substrate having wiring lines thereon;

forming an insulating film that covers entire upper surfaces of the wiring lines, the insulating film comprising a silane-derived compound expressed by the general formula SiH$_x$(CH$_3$)$_y$O$_{2-(x+y)/2}$, where $0<x<1$, $0.2 \leq y \leq 1$, $x+y \leq 1$, wherein entire portions of the insulating film have been heated at a temperature of about 400° C.

6. The method of claim 5, wherein at least 20% of the silicon atoms are each bonded to three of the oxygen atoms and one of the carbon atoms.

7. The method of claim 5, wherein $0.2 \leq y \leq 0.8$.

8. The method of claim 5, wherein x is sufficiently large to reduce a dielectric constant of the insulating film.

9. The method of claim 5, wherein the insulating film consists essentially of silicon atoms each bonded to at least three oxygen atoms.

10. A method of forming a semiconductor device, comprising:

providing a semiconductor substrate having wiring lines thereon;

forming an insulating film that covers entire upper surfaces of the wiring lines, the insulating film comprising a silane-derived compound expressed by the general formula $SiH_x(CH_3)_yO_{2-(x+y)/2}$, where $0<x<1$, $0.2 \leq y<1$, $x+y \leq 1$, wherein a crosslinked network of Si—O—Si being developed in entire portions of the compound, at least 20% of the silicon atoms are each bonded to three of the oxygen atoms and one of the carbon atoms.

11. The method of claim 10, wherein $0.2 \leq y \leq 0.8$.

12. The method of claim 10, wherein the insulating film consists essentially of silicon atoms each bonded to at least three oxygen atoms.

13. A method of forming a semiconductor device, comprising:

providing a semiconductor substrate having wiring lines thereon;

forming an insulating film that covers the wiring lines, a major portion of the insulating film consisting essentially of a silane-derived compound including silicon, oxygen, hydrogen and carbon atoms, wherein Si—H and Si—C bonds are present in the compound, and wherein the insulating film has been heated at a temperature of about 400° C. and a proportion of the Si—C bonds to the silicon atoms is not less than 0.2, all of the Si—C bonds in the compound are formed between the silicon atoms and methyl groups, and optionally between the silicon atoms and phenyl groups.

14. The method of claim 13, wherein at least 20% of the silicon atoms are each bonded to three of the oxygen atoms and one of the carbon atoms.

15. The method of claim 13, wherein the proportion of the Si—C bonds to the silicon atoms is between 0.2 and 0.8.

16. The method of claim 13, wherein the major portion of the insulating film consists essentially of silicon atoms each bonded to at least three oxygen atoms.

17. A method of forming a semiconductor device, comprising:

providing a semiconductor substrate having wiring lines thereon;

forming a silicon-oxygen based insulating film that covers the wiring lines, the insulating film consisting essentially of silicon, oxygen, hydrogen and carbon atoms, wherein Si—H and Si—C bonds are present in the insulating film, and wherein the insulating film has been heated at a temperature of about 400° C. and a proportion of the Si—C bonds to the silicon atoms is not less than 0.2, all of the Si—C bonds in the insulating film are formed between the silicon atoms and methyl groups, and optionally between the silicon atoms and phenyl groups.

18. The method of claim 17, wherein at least 20% of the silicon atoms are each bonded to three of the oxygen atoms and one of the carbon atoms.

19. The method of claim 17, wherein the insulating film consists essentially of silicon atoms each bonded to at least three oxygen atoms.

20. The method of claim 17, wherein the proportion of the Si—C bonds to the silicon atoms is between 0.2 and 0.8.

21. A method of forming a semiconductor device, comprising:

providing a semiconductor substrate having wiring lines thereon;

forming a silicon-oxygen based insulating film that covers entire upper surfaces of the wiring lines, the insulating film comprising silicon, oxygen, hydrogen and carbon atoms, wherein Si—H and Si—C bonds are present in the insulating film, wherein all of the Si—C bonds in the insulating film are formed between the silicon atoms and methyl groups, and optionally between the silicon atoms and phenyl groups, and wherein entire portions of the insulating film have been heated at a temperature of about 400° C. and a proportion of the Si—C bonds to the silicon atoms is not less than 0.2.

22. The method of claim 21, wherein at least 20% of the silicon atoms are each bonded to three of the oxygen atoms and one of the carbon atoms.

23. The method of claim 21, wherein the insulating film consists essentially of silicon atoms each bonded to at least three oxygen atoms.

24. A method of forming a semiconductor device, comprising:

providing a semiconductor substrate having wiring lines thereon;

forming a silicon-oxygen based insulating film that covers entire upper surfaces of the wiring lines, the insulating film comprising silicon, oxygen, hydrogen and carbon atoms, wherein Si—H and Si—C bonds are present in the insulating film, wherein all of the Si—C bonds in the insulating film are formed between the silicon atoms and methyl groups, and optionally between the silicon atoms and phenyl groups, a crosslinked network of Si—O—Si being developed in entire portions of the insulating film, and at least 20% of the silicon atoms are each bonded to three of the oxygen atoms and one of the carbon atoms.

25. The method of claim 24, wherein the insulating film atoms each bonded to at least three oxygen atoms.

* * * * *